US009275836B2

(12) United States Patent
Himori

(10) Patent No.: US 9,275,836 B2
(45) Date of Patent: Mar. 1, 2016

(54) PLASMA PROCESSING APPARATUS AND PLASMA PROCESSING METHOD

(75) Inventor: Shinji Himori, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 594 days.

(21) Appl. No.: 12/848,342

(22) Filed: Aug. 2, 2010

(65) Prior Publication Data

US 2011/0031217 A1 Feb. 10, 2011

Related U.S. Application Data

(60) Provisional application No. 61/238,258, filed on Aug. 31, 2009.

(30) Foreign Application Priority Data

Aug. 4, 2009 (JP) .................................. 2009-181738

(51) Int. Cl.
*H01J 37/32* (2006.01)

(52) U.S. Cl.
CPC ..... *H01J 37/32165* (2013.01); *H01J 37/32091* (2013.01); *H01J 37/32174* (2013.01); *H01J 37/32715* (2013.01)

(58) Field of Classification Search
CPC ............ H01L 21/6831; H01L 21/6833; C23C 16/4586; H01J 37/32642; H01J 37/32697; H01J 37/32706; H01J 37/3438; H01J 37/32091; H01J 37/3237; H01J 37/32155; H01J 37/32165; H01J 37/32174; H01J 37/32568; H01J 37/32577; H01J 37/32715

USPC ........... 118/723 E, 723 I; 156/345.43–345.48
See application file for complete search history.

(56) References Cited

U.S. PATENT DOCUMENTS

| 5,315,473 | A  | * | 5/1994 | Collins et al. ................. 361/234 |
| 6,042,686 | A  | * | 3/2000 | Dible ................ H01J 37/32009 118/723 E |
| 6,367,413 | B1 | * | 4/2002 | Sill et al. .................... 118/723 E |
| 6,423,176 | B1 | * | 7/2002 | Ito et al. .................... 156/345.47 |

(Continued)

FOREIGN PATENT DOCUMENTS

| CN | 1845299 A | 10/2006 |
| CN | 1984523 A | 6/2007 |

(Continued)

*Primary Examiner* — Karla Moore
*Assistant Examiner* — Benjamin Kendall
(74) *Attorney, Agent, or Firm* — Pearne & Gordon LLP

(57) ABSTRACT

A plasma processing apparatus includes: a processing chamber that accommodates a substrate therein; a lower electrode positioned within the processing chamber and serving as a mounting table; an upper electrode positioned to face the lower electrode within the processing chamber; a first high frequency power supply that applies high frequency power for plasma generation of a first frequency to the lower electrode or the upper electrode; a second high frequency power supply that applies high frequency power for ion attraction of a second frequency lower than the first frequency to the lower electrode; at least one bias distribution control electrode positioned at least in a peripheral portion above the lower electrode; and at least one bias distribution control power supply that applies an AC voltage or a square wave voltage of a third frequency lower than the second frequency to the at least one bias distribution control electrode.

1 Claim, 2 Drawing Sheets

(56) References Cited

U.S. PATENT DOCUMENTS

| | | | |
|---|---|---|---|
| 6,475,336 B1* | 11/2002 | Hubacek | 156/345.51 |
| 7,264,688 B1* | 9/2007 | Paterson et al. | 156/345.34 |
| 8,187,415 B2* | 5/2012 | Kim et al. | 156/345.44 |
| 2006/0175015 A1* | 8/2006 | Chen et al. | 156/345.44 |
| 2006/0196605 A1 | 9/2006 | Ikegami | |
| 2007/0163995 A1* | 7/2007 | Sugimoto et al. | 216/67 |
| 2008/0073032 A1* | 3/2008 | Koshiishi et al. | 156/345.51 |
| 2008/0236492 A1* | 10/2008 | Yamazawa | 118/723.1 |
| 2009/0120367 A1* | 5/2009 | Porshnev et al. | 118/723 E |
| 2010/0096084 A1* | 4/2010 | Lee et al. | 156/345.33 |
| 2010/0203736 A1* | 8/2010 | Ichino et al. | 438/710 |

FOREIGN PATENT DOCUMENTS

| | | |
|---|---|---|
| JP | 09-176860 A | 7/1997 |
| JP | 63-024623 A | 2/1998 |
| JP | 2000-183038 A | 6/2000 |
| JP | 2008-527634 A | 7/2008 |
| WO | 2006/074050 A2 | 7/2006 |

* cited by examiner

PLASMA PROCESSING APPARATUS AND PLASMA PROCESSING METHOD

CROSS-REFERENCE TO RELATED APPLICATION

This application claims the benefit of U.S. Provisional Application Ser. No. 61/238,258 filed on Aug. 31, 2009 and Japanese Patent Application No. 2009-181738 filed on Aug. 4, 2009, the entire disclosures of which are incorporated herein by reference.

FIELD OF THE INVENTION

The present disclosure relates to a plasma processing apparatus and a plasma processing method.

BACKGROUND OF THE INVENTION

Conventionally, in the field of semiconductor device manufacturing or the like, there has been known a plasma processing apparatus in which a process is performed onto a target substrate such as a semiconductor wafer by generating plasma in an airtightly sealed processing chamber. As a plasma processing apparatus, a plasma etching apparatus has been known.

As a plasma etching apparatus, there has been used a so-called capacitively coupled plasma etching apparatus in which plasma is generated by applying high frequency power between a mounting table (a lower electrode) on which a target substrate such as a semiconductor wafer is mounted and a shower head (an upper electrode) positioned above the mounting table to face the mounting table.

In the capacitively coupled plasma etching apparatus, an etching target area with respect to an excitation etching gas per unit volume is large near the center of the semiconductor wafer and small in the periphery of the semiconductor wafer, and, thus, an etching rate is low near the center of the semiconductor wafer and high in the periphery of the semiconductor wafer. Such a difference in the etching processing rate may cause deterioration of intra-surface uniformity of a process. For this reason, there has been suggested a method of uniformizing an intra-surface processing rate by concentrically dividing at least one of the upper electrode and the lower electrode into plural ones and changing the high frequency powers to be applied to the divided electrodes (see, for example, Patent Document 1).

Patent Document 1: Japanese Patent Laid-open Publication No. S63-24623

As described above, in the conventional technology, an upper electrode or a lower electrode, to which high frequency power for generating plasma for a plasma process is applied, is divided and the high frequency power to be applied to each of the divided electrodes is controlled so as to improve intra-surface uniformity of a process. However, in accordance with this technology, the upper electrode or the lower electrode to which high power is applied needs be divided. Thus, there is a problem in that manufacturing costs of the apparatus greatly increases. Further, since the high frequency power for generating plasma is controlled, a state of the plasma becomes unstable. Thus, there is a problem in that fine control of a processing state is difficult.

Furthermore, by way of example, a low damage plasma etching process has recently been performed using high density plasma by applying a first high frequency power for plasma generation of several tens of MHz or higher, e.g., about 100 MHz and a second high frequency power for ion attraction of a lower frequency (for example, from about 3 MHz to about 13.56 MHz) than that of the first high frequency power. However, in such a technology using a high frequency power, an absolute value of a DC bias (Vdc) is low in a peripheral portion of a semiconductor wafer, and, thus, an etching rate of the peripheral portion tends to decrease, which may cause deterioration in intra-surface uniformity of an etching process.

BRIEF SUMMARY OF THE INVENTION

In view of the foregoing, the present invention has been conceived to solve the above-described conventional problem and provides a plasma processing apparatus and a plasma processing method capable of preventing an increase in manufacturing costs of an apparatus and improving intra-surface uniformity of a plasma process by finely controlling a processing state of the plasma process.

In accordance with one aspect of the present disclosure, there is provided a plasma processing apparatus including a processing chamber that accommodates a substrate therein; a lower electrode positioned within the processing chamber and serving as a mounting table on which the substrate is mounted; an upper electrode positioned to face the lower electrode within the processing chamber; a first high frequency power supply applying high frequency power for plasma generation of a first frequency to the lower electrode or the upper electrode; a second high frequency power supply that applies high frequency power for ion attraction of a second frequency lower than the first frequency to the lower electrode; at least one bias distribution control electrode positioned at least in a peripheral portion above the lower electrode while being electrically insulated from the lower electrode; and at least one bias distribution control power supply that applies an AC voltage or a square wave voltage of a third frequency lower than the second frequency to the at least one bias distribution control electrode.

In accordance with another aspect of the present disclosure, there is provided a plasma processing method using a plasma processing apparatus including a processing chamber that accommodates a substrate therein; a lower electrode positioned within the processing chamber and serving as a mounting table on which the substrate is mounted; an upper electrode positioned to face the lower electrode within the processing chamber; a first high frequency power supply that applies high frequency power for plasma generation of a first frequency to the lower electrode or the upper electrode; and a second high frequency power supply that applies high frequency power for ion attraction of a second frequency lower than the first frequency to the lower electrode. Further, the method includes providing a bias distribution control electrode at least in a peripheral portion above the lower electrode while being electrically insulated from the lower electrode, and applying an AC voltage or a square wave voltage of a third frequency lower than the second frequency to the bias distribution control electrode from a bias distribution control power supply and controlling a bias distribution above the lower electrode.

In accordance with the present disclosure, an increase in manufacturing costs of an apparatus may be suppressed and intra-surface uniformity of a plasma process may be improved by finely controlling a processing state of the plasma process.

BRIEF DESCRIPTION OF THE DRAWINGS

The disclosure may best be understood by reference to the following description taken in conjunction with the following figures.

DETAILED DESCRIPTION OF THE INVENTION

Figure 1:
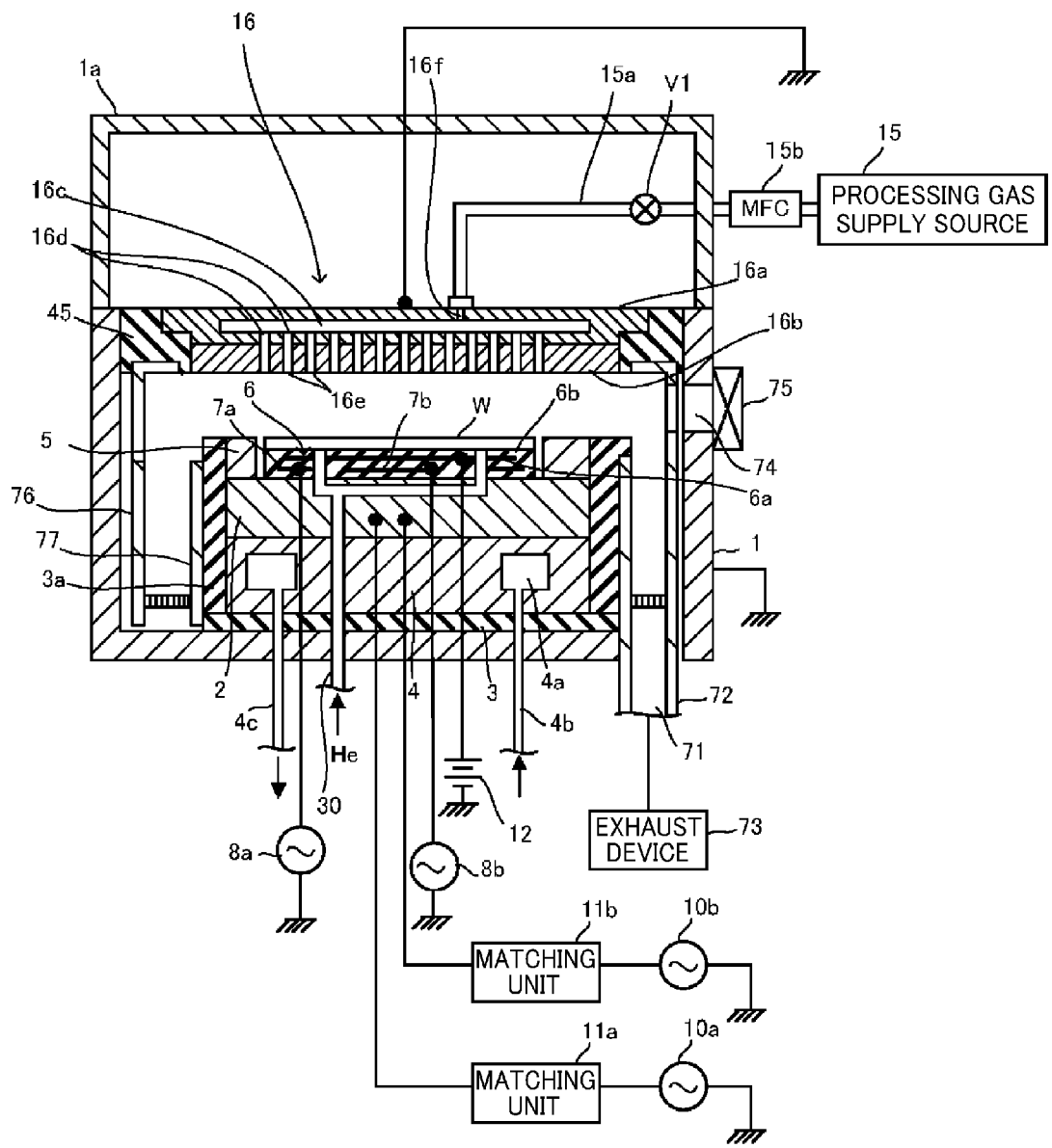
FIG. 1 schematically shows a configuration of a plasma etching apparatus in accordance with an embodiment of the present invention.

Hereinafter, embodiments of the present invention will be described with reference to the accompanying drawings. FIG. 1 schematically shows a cross-sectional configuration view of a plasma etching apparatus as a plasma processing apparatus in accordance with an embodiment of the present invention.

The plasma etching apparatus includes an airtightly sealed processing chamber 1 which is electrically grounded. The processing chamber 1 is of a cylindrical shape and is made of, e.g., aluminum of which a surface is anodically oxidized. Installed in the processing chamber 1 is a mounting table 2 configured to horizontally hold thereon a semiconductor wafer W as a processing target object. The mounting table 2 is made of, e.g., aluminum. The mounting table 2 is supported by a conductive support 4 on an insulating plate 3. A focus ring 5 made of, e.g., single-crystalline silicon is installed on a peripheral portion of a top surface of the mounting table 2. Further, a cylindrical inner wall 3a made of, e.g., quartz is configured to surround the mounting table 2 and the support 4.

A first RF power supply 10a and a second RF power supply 10b are connected to the mounting table 2 via a first matching unit 11a and a second matching unit 11b, respectively. The first RF power supply 10a is for plasma generation, and a high frequency power of a preset frequency (equal to or greater than about 27 MHz, e.g., about 40 MHz) is supplied from the first RF power supply 10a to the mounting table 2. Further, the second RF power supply 10b is for ion attraction, and a high frequency power of a predetermined frequency ranging from about 3 MHz to about 13.56 MHz (e.g., about 13.56 MHz) lower than that of the first RF power supply 10a is supplied from the second RF power supply 10b to the mounting table 2. Meanwhile, a shower head 16 which is electrically grounded is installed above the mounting table 2, facing the mounting table 2. The mounting table 2 and the shower head 16 are configured to function as a pair of electrodes, i.e., a lower electrode and an upper electrode.

An electrostatic chuck 6 configured to electrostatically attract and hold the semiconductor wafer W thereon is provided on the top surface of the mounting table 2. The electrostatic chuck 6 includes an insulator 6b and an electrostatic chuck electrode 6a embedded therein, and the electrostatic chuck electrode 6a is connected to an electrostatic chuck DC power supply 12. The semiconductor wafer W is attracted and held by a Coulomb force generated by applying a DC voltage to the electrostatic chuck electrode 6a from the electrostatic chuck DC power supply 12.

Figure 2:
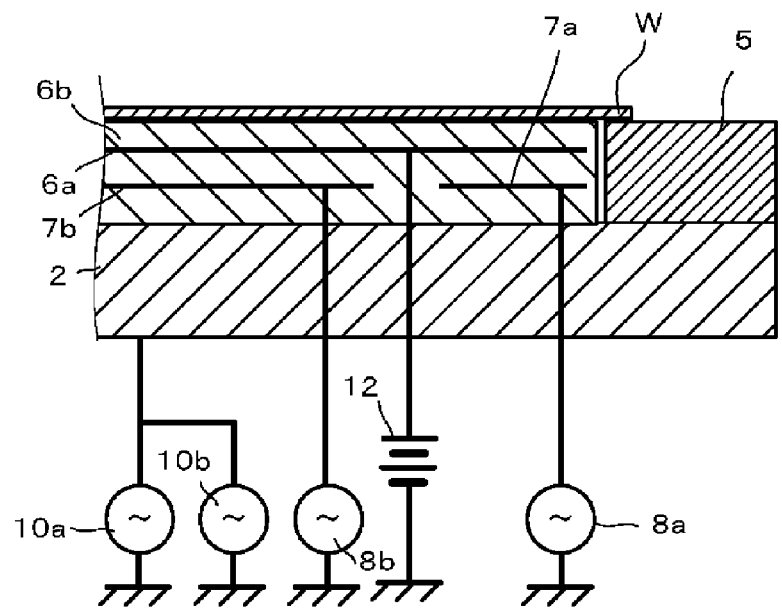
FIG. 2 schematically shows an enlarged view of main parts of the plasma etching apparatus of FIG. 1.

As illustrated in FIG. 2 which shows an enlarged view of main parts of the mounting table 2, in the present embodiment, bias distribution control electrodes 7a and 7b are provided below the electrostatic chuck electrode 6a in the insulator 6b while being electrically insulated from the mounting table 2 (a lower electrode). The bias distribution control electrode 7a is formed in a ring shape and positioned in a peripheral portion above the mounting table 2, whereas the bias distribution control electrode 7b is formed in a circular shape and positioned at a central portion above the mounting table 2.

These bias distribution control electrodes 7a and 7b are concentrically arranged. Further, as described above, a DC bias (Vdc) tends to be easily non-uniform in the peripheral portion of the mounting table 2. In order to solve the non-uniformity of the DC bias (Vdc) in the peripheral portion of the mounting table 2, at least the bias distribution control electrode 7a is provided, and the bias distribution control electrode 7b at the central portion above the mounting table 2 may be omitted.

The bias distribution control electrode 7a is electrically connected with a bias distribution control power supply 8a and the bias distribution control electrode 7b is electrically connected with a bias distribution control power supply 8b. Applied from these bias distribution control power supplies 8a and 8b is an AC voltage or a square wave voltage having a frequency ranging, for example, from about 100 KHz to about 1 MHz which is lower than the frequency of the second RF power supply 10b. If the square wave voltage is applied, a duty ratio may be varied in the range, for example, from about 10% to about 90% if necessary. The voltage applied from the bias distribution control power supplies 8a and 8b is in the range, for example, from about 1 V to about 500 V.

The bias distribution control electrodes 7a and 7b and the bias distribution control power supplies 8a and 8b are provided to control a DC bias (Vdc) of the mounting table 2 serving as a lower electrode. By way of example, when an absolute value of the DC bias (Vdc) tends to decrease in the peripheral portion because the high frequency power having a high frequency of about 100 MHz is supplied from the first RF power supply 10a, the absolute value (minus potential) of the DC bias (Vdc) in the peripheral portion is controlled to be increased by the bias distribution control electrode 7a provided in the peripheral portion. In this way, intra-surface uniformity of an etching process can be improved.

Further, even if the DC bias (Vdc) is uniform, there is a certain tendency for a film thickness in a film forming process as a pre-treatment. For example, there is a tendency to increase the film thickness at a central portion of the semiconductor wafer W. In this case, the bias distribution control electrodes 7a and 7b and the bias distribution control power supplies 8a and 8b may control a bias distribution to increase the absolute value of the DC bias (Vdc) at the central portion, and, thus, an etching rate at the central portion can be increased. That is, by controlling the bias distribution to have a certain tendency, it may be possible to improve intra-surface uniformity of patterns to be formed.

As depicted in FIG. 1, a coolant path 4a is provided within the mounting table 2, and a coolant inlet pipe 4b and a coolant outlet pipe 4c are coupled to the coolant path 4a. By circulating a proper coolant such as cooling water through the coolant path 4a, the support 4 and the mounting table 2 can be controlled to a preset temperature. Further, a backside gas supply pipe 30 for supplying a cold heat transfer gas (backside gas) such as a helium gas to the rear side of the semiconductor wafer W is formed through the mounting table 2 and so forth. This backside gas supply pipe 30 is connected to a non-illustrated backside gas supply source. With such configurations, the semiconductor wafer W held on the top surface of the mounting table 2 by the electrostatic chuck 6 can be controlled to a preset temperature.

The shower head 16 is installed at a ceiling wall of the processing chamber 1. The shower head 16 includes a main body 16a and a top plate 16b serving as an electrode plate. The shower head 16 is supported at a top portion of the processing chamber 1 via a supporting member 45. The main body 16a is made of a conductive material such as aluminum of which surface is anodically oxidized, and the top plate 16b is detachably supported on a bottom portion of the main body 16a.

A gas diffusion space 16c is formed within the main body 16a, and a multiple number of gas through holes 16d are formed in a bottom portion of the main body 16a so as to be located under the gas diffusion space 16c. Further, gas introduction holes 16e are formed through the top plate 16b in its thickness direction so as to be connected with the gas through holes 16d. With this configuration, a processing gas supplied into the gas diffusion space 16c is dispersedly introduced into the processing chamber 1 via the gas through holes 16d and the gas introduction holes 16e, as in a shower device. A non-illustrated pipe or the like for circulating a coolant is installed in the main body 16a and so forth, and, thus, the shower head 16 can be cooled to a predetermined temperature during a plasma etching process.

The main body 16a is provided with a gas inlet 16f through which the processing gas is introduced into the gas diffusion space 16c. The gas inlet 16f is connected to one end of a gas supply pipe 15a, and the other end of the gas supply pipe 15a is connected to a processing gas supply source 15 that supplies a processing gas for etching. A mass flow controller (MFC) 15b and an opening/closing valve V1 are provided on the gas supply pipe 15a in sequence from the upstream side. Further, a processing gas for plasma etching is supplied into the gas diffusion space 16c via the gas supply pipe 15a from the processing gas supply source 15, and then the processing gas is dispersedly supplied into the processing chamber 1 via the gas through holes 16d and the gas introduction holes 16e from the gas diffusion space 16c, as in a shower device.

A cylindrical ground conductor 1a is extended upward from a sidewall of the processing chamber 1 to be located at a position higher than the shower head 16. The cylindrical ground conductor 1a has a ceiling plate at the top thereof.

A gas exhaust port 71 is provided at a bottom portion of the processing chamber 1, and a gas exhaust unit 73 is connected to the gas exhaust port 71 via a gas exhaust pipe 72. By operating a vacuum pump provided in the gas exhaust unit 73, the processing chamber 1 can be depressurized to a preset vacuum level. Further, a loading/unloading port 74 for the wafer W is provided at a sidewall of the processing chamber 1, and a gate valve 75 for opening and closing the loading/unloading port 74 is provided at the loading/unloading port 74.

Reference numerals 76 and 77 in FIG. 1 denote detachable deposition shields. The deposition shield 76 is installed along an inner wall surface of the processing chamber 1 so as to prevent adhesion of etching byproducts (deposits) to the processing chamber 1.

The overall operation of the plasma etching apparatus configured as described above is controlled by the control unit 60. The control unit 60 includes a process controller having a CPU, for controlling individual parts of the plasma etching apparatus, a user interface 62, and a storage unit 63.

The user interface 62 includes a keyboard with which a process manager inputs a command to operate the plasma etching apparatus, a display for visualizing and displaying an operational status of the plasma etching apparatus, and so forth.

The storage unit 63 stores therein, e.g., control programs (software) for executing various processes performed in the plasma etching apparatus under the control of the process controller 61, and recipes including processing condition data and the like. When a command is received from the user interface 62 or the like, the process controller 61 retrieves a necessary recipe from the storage unit 63 and executes it.

Accordingly, a desired process is performed in the plasma etching apparatus under the control of the process controller 61. The control programs and the recipes including the processing condition data can be read out from a computer-readable storage medium (e.g., a hard disk, a CD, a flexible disk, a semiconductor memory, and the like), or can be used on-line by receiving them from another apparatus via a dedicated line, whenever necessary, for example.

Below, a sequence for plasma-etching a film, which is formed on a semiconductor wafer W, by the plasma etching apparatus configured as described above will be explained. First, the gate valve 75 is opened, and a semiconductor wafer W is loaded into the processing chamber 1 from a non-illustrated load lock chamber by a non-illustrated transport robot or the like through the loading/unloading port 74, and the semiconductor wafer W is mounted on the mounting table 2. Then, the transport robot is retreated from the processing chamber 1, and the gate valve 75 is closed. Subsequently, the processing chamber 1 is evacuated through the gas exhaust port 71 by the vacuum pump of the gas exhaust unit 73.

When the inside of the processing chamber 1 reaches a preset vacuum level, a processing gas (etching gas) is supplied from the processing gas supply source 15, and the inside of the processing chamber 1 is maintained at a certain pressure, e.g., about 3.99 Pa (about 30 mTorr). While maintaining this pressure level, a high frequency power having a frequency of, e.g., about 100 MHz is supplied to the mounting table 2 from the first RF power supply 10a. Further, from the second RF power supply 10b, a high frequency power (bias) having a frequency of, e.g., 13.56 MHz is supplied to the mounting table 2 so as to attract ions. At this time, a DC voltage is applied from the electrostatic chuck DC power supply 12 to the electrostatic chuck electrode 6a of the electrostatic chuck 6, and, thus, the semiconductor wafer W is attracted by a Coulomb force.

By applying the high frequency powers to the mounting table 2 serving as the lower electrode as described above, an electric field is generated between the shower head 16 serving as the upper electrode and the mounting table 2 serving as the lower electrode. Thus, an electric discharge is generated in a processing space in which the semiconductor wafer W is located. Therefore, a film formed on a surface of the semiconductor wafer W is etched by plasma of the processing gas.

During this etching process, if a bias distribution needs to be controlled due to non-uniformity of the DC bias (Vdc), distribution of the DC bias (Vdc) is controlled by the bias distribution control electrodes 7a and 7b and the bias distribution control power supplies 8a and 8b. Accordingly, it is possible to improve intra-surface uniformity of an etching rate in an etching process.

Further, when the etching process is ended, the supply of the high frequency powers and the supply of the processing gas are stopped and the semiconductor wafer W is unloaded from the processing chamber 1 in a reverse order to the above describe sequence.

Figure 3:
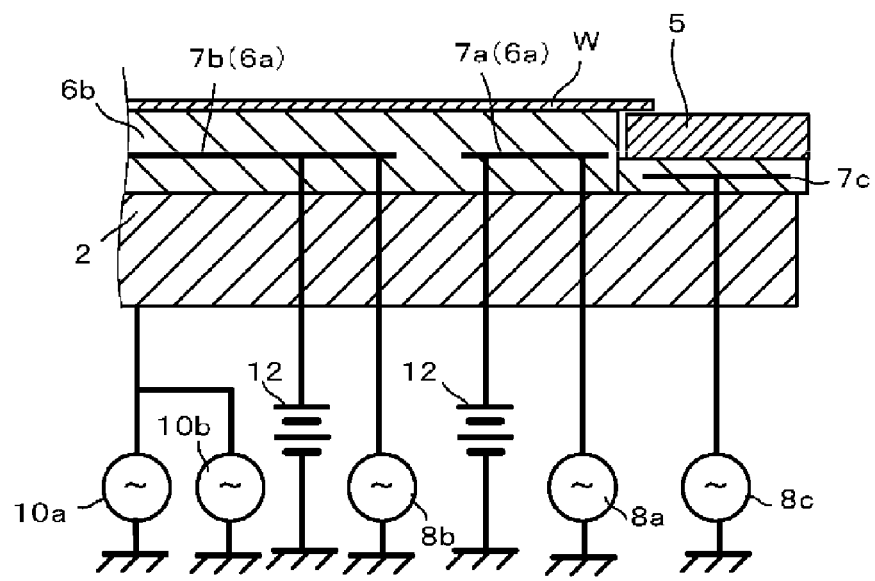
FIG. 3 schematically shows an enlarged view of main parts of a plasma etching apparatus in accordance with another embodiment.

Hereinafter, another embodiment will be explained with reference to FIG. 3. Some parts of FIG. 3 corresponding to the embodiment described in FIGS. 1 and 2 will be assigned same reference numerals and description thereof will be omitted. As depicted in FIG. 3, in the present embodiment, bias distribution control electrodes 7a and 7b are electrically connected with an electrostatic chuck DC power supply 12 and, thus, the bias distribution control electrodes 7a and 7b also serve as an electrostatic chuck electrode 6a. With this configuration, there is no need to additionally install an electrostatic chuck electrode, and, thus, manufacturing costs of an apparatus can be reduced.

Further, installed at a bottom side of a focus ring 5 is a bias distribution control electrode 7c and this bias distribution control electrode 7c is electrically connected with a bias distribution control power supply 8c. Furthermore, the bias distribution control power supply 8c has the same configuration as the above-stated bias distribution control power supplies 8a and 8b. With this configuration, it is possible to lessen a change in an etching process characteristic at a peripheral portion (an edge portion) of a semiconductor wafer W caused by, for example, erosion of the focus ring 5 by applying a voltage to the bias distribution control electrode 7c from the bias distribution control power supply 8c. Therefore, a lifespan of the focus ring 5 can be extended.

Although the embodiment of the present disclosure has been described in the above, the present disclosure is not limited to the above-stated embodiment but can be modified in various ways. By way of example, the plasma etching apparatus is not limited to the parallel plate type apparatus that applies dual frequency powers to the lower electrode as illustrated in FIG. 1. By way of example, the present disclosure is applicable to various kinds of plasma etching apparatuses such as a type that applies high frequency powers of different frequencies to an upper electrode and a lower electrode, respectively, or applicable to various kinds of other plasma processing apparatuses.

What is claimed is:

1. A plasma processing method using a plasma processing apparatus including a processing chamber that accommodates a substrate therein; a lower electrode positioned within the processing chamber and serving as a mounting table on which the substrate is mounted; an upper electrode positioned to face the lower electrode within the processing chamber; a first high frequency power supply that applies high frequency power for plasma generation of a first frequency to the lower electrode; a second high frequency power supply that applies high frequency power for ion attraction of a second frequency lower than the first frequency to the lower electrode; first and second bias distribution control electrodes positioned above the lower electrode and within an insulator while being separated from and electrically insulated from the lower electrode by the insulator; first and second bias distribution control power supplies configured to apply a square wave voltage of a third frequency lower than the second frequency to the first and second bias distribution control electrode; a focus ring installed on a peripheral portion of a top surface of the lower electrode; a third bias distribution control electrode positioned below the focus ring; and a third bias distribution control power supply configured to apply the square wave voltage of the third frequency lower than the second frequency to the third bias distribution control electrode, the method comprising:

applying a first square wave voltage of the third frequency lower than the second frequency to the first bias distribution control electrode from the first bias distribution control power supply and controlling a bias distribution above the lower electrode;

applying a second square wave voltage of the third frequency lower than the second frequency to the second bias distribution control electrode from the second bias distribution control power supply and controlling a bias distribution above the lower electrode;

applying a third square wave voltage of the third frequency lower than the second frequency to the third bias distribution control electrode from the third bias distribution control power supply and controlling a bias distribution above the lower electrode;

applying a DC voltage to the first bias distribution control electrode from an electrostatic chuck DC power supply to control the first bias distribution control electrode to serve as an electrode of an electrostatic chuck configured to electrostatically attract the substrate; and applying a DC voltage to the second bias distribution control electrode from the electrostatic chuck DC power supply to control the second bias distribution control electrode to serve as an electrode of the electrostatic chuck configured to electrostatically attract the substrate, wherein the first bias distribution control electrode is positioned at a central portion of the insulator, and the second bias distribution control electrode is positioned at a peripheral portion of the insulator while being concentrically arranged with the first bias distribution control electrode, the first bias distribution control electrode is electrically connected with the electrostatic chuck DC power supply and the first bias distribution control power supply, the second bias distribution control electrode is electrically connected with the electrostatic chuck DC power supply and the second bias distribution control power supply, and the third bias distribution control electrode is electrically connected with the third bias distribution control power supply without being connected with an electrostatic chuck DC power supply, and without being connected with the first bias distribution control power supply and the second bias distribution control power supply.

* * * * *